United States Patent
Spesser et al.

(10) Patent No.: US 11,290,079 B2
(45) Date of Patent: Mar. 29, 2022

(54) DEVICE FOR FILTERING AT LEAST ONE SIGNAL

(71) Applicant: Dr. Ing. h.c. F. Porsche Aktiengesellschaft, Stuttgart (DE)

(72) Inventors: Daniel Spesser, Illingen (DE); Tim Pfizenmaier, Leonberg (DE); Florian Mayer, Freiberg am Neckar (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 0 days.

(21) Appl. No.: 17/097,027

(22) Filed: Nov. 13, 2020

(65) Prior Publication Data

US 2021/0152144 A1 May 20, 2021

(30) Foreign Application Priority Data

Nov. 14, 2019 (DE) ...................... 10 2019 130 709.0

(51) Int. Cl.
*H03H 7/01* (2006.01)
*H03H 7/42* (2006.01)
*H03H 1/00* (2006.01)

(52) U.S. Cl.
CPC ............ *H03H 7/0115* (2013.01); *H03H 1/00* (2013.01); *H03H 7/427* (2013.01); *H03H 1/0007* (2013.01); *H03H 2001/0035* (2013.01)

(58) Field of Classification Search
CPC ..... H03H 7/427; H03H 1/0007; H03H 7/0115
USPC ................................. 333/181, 185
See application file for complete search history.

(56) References Cited

U.S. PATENT DOCUMENTS

| 5,726,611 | A | * | 3/1998 | Takagi | ..................... H01F 17/06 333/181 |
| 8,091,211 | B2 | | 1/2012 | Hasu et al. | |
| 9,479,105 | B2 | * | 10/2016 | Rozman | ................. H02P 29/50 |
| 10,277,116 | B2 | | 4/2019 | Naito et al. | |
| 11,025,141 | B2 | | 6/2021 | Kagawa et al. | |
| 2007/0290670 | A1 | | 12/2007 | Lee | |

(Continued)

FOREIGN PATENT DOCUMENTS

| DE | 19829424 A1 | 1/1999 |
| DE | 112007001155 T5 | 7/2009 |
| JP | 08078254 A | 3/1996 |

(Continued)

OTHER PUBLICATIONS

Japanese Notification of Reason for Rejection for Japanese Application No. 2020-187949, dated Sep. 28, 2021, with translation, 22 pages.

*Primary Examiner* — Rakesh B Patel
(74) *Attorney, Agent, or Firm* — RatnerPrestia (57) ABSTRACT

A device for filtering at least one signal has a first magnet core and at least one first coil. The first coil has a first coil connection, a second coil connection, a first coil element, a second coil element and a connecting section. The first coil connection is electrically connected to the second coil connection via the first coil element, the connecting section and the second coil element. The first coil element has a first coil axis and the second coil element has a second coil axis. The first coil axis and second coil axis are arranged parallel to and at a distance from one another. The first magnet core extends both through the first coil element and also through the second coil element.

16 Claims, 4 Drawing Sheets

(56) References Cited

U.S. PATENT DOCUMENTS

2012/0223797 A1     9/2012   Won et al.
2017/0309395 A1    10/2017   Shiraki et al.

FOREIGN PATENT DOCUMENTS

| JP | 11273975 | A | 10/1999 |
| JP | 2000195725 | A | 7/2000 |
| JP | 2000200723 | A | 7/2000 |
| JP | 2001167947 | A | 6/2001 |
| JP | 2007305833 | A | 11/2007 |
| JP | 2009218530 | A | 9/2009 |
| JP | 2012059967 | A | 3/2012 |
| JP | 6261689 | B1 | 1/2018 |
| WO | 2017170817 | A1 | 10/2017 |

\* cited by examiner

DEVICE FOR FILTERING AT LEAST ONE SIGNAL

CROSS-REFERENCE TO RELATED APPLICATION

This application claims priority to German Patent Application No. 10 2019 130 709.0, filed Nov. 14, 2019, the content of such application being incorporated by reference herein in its entirety.

FIELD OF THE INVENTION

The invention relates to a device for filtering at least one signal.

BACKGROUND OF THE INVENTION

JP 2012-59967 A, JP 2000-200723 A and JP 2000-195725 A, which are incorporated herein by reference, describe a device with a double coil.

US 2017/0309395 A1, US 2012/0223797 A1, DE 198 29 424 A1 and JP 2007-305833 A, which are incorporated herein by reference, describe arrangements with coils.

With a conventional arrangement of at least three filter coils on a circular annular core, at least some inputs of the filter coils are always next to outputs of adjacent filter coils. This can lead to undesired radiation coupling.

SUMMARY OF THE INVENTION

A device for filtering at least one signal has a first magnet core and at least one first coil, which first coil has a first coil connection, a second coil connection, a first coil element, a second coil element and a connecting section, which first coil connection is electrically connected to the second coil connection via the first coil element, the connecting section and the second coil element, which first coil element has a first coil axis and which second coil element has a second coil axis, which first coil axis and second coil axis are arranged parallel to and at a distance from one another, and which first magnet core extends both through the first coil element and also through the second coil element.

Owing to the configuration of the first coil, the input end and the output end can be spatially separated from one another, and undesired influencing between the first coil connection and the second coil connection by radiation coupling can be reduced.

According to a preferred embodiment, the first coil element and the second coil element are wound in opposite directions in order to, given a prespecified current through the first coil, create induction in a first direction in the first coil axis and create induction in a second direction in the second coil axis, which second direction is opposite to the first direction. Owing to the winding in opposite directions, the magnetic flux which is transmitted via the magnet core can amplify the output signal. Given the same direction, attenuation would occur owing to the magnetic flux.

According to a preferred embodiment, the first coil axis and the second coil axis define a first plane. A first plane, which is helpful for the further definitions, is defined by two parallel coil axes.

According to a preferred embodiment, the first coil connection and the second coil connection are arranged on a first side of the first plane and point away from the first plane. The arrangement on the same side of the first plane renders possible connection of the coil connections on a common carrier, for example on a printed circuit board. On account of the coil connections pointing away from the first plane, they can be easily connected to a carrier on the first side.

According to a preferred embodiment, the first coil connection and the second coil connection point perpendicularly away from the first plane. As a result, the coil can be horizontally fastened to a carrier.

According to a preferred embodiment, a second plane is defined in that it is perpendicular to the first plane and the first coil axis is contained in it, and a third plane is defined in that it is perpendicular to the first plane and the second coil axis is contained in it, the first coil connection is provided on that side of the second plane which is averted from the second coil axis, and the second coil connection is provided on that side of the third plane which is averted from the first coil axis. Owing to this arrangement, the first coil connection and the second coil connection are arranged relatively far away from one another, and the risk of radiation coupling is reduced.

According to a preferred embodiment, a second plane is defined in that it is perpendicular to the first plane and the first coil axis is contained in it, and a third plane is defined in that it is perpendicular to the first plane and the second coil axis is contained in it, the first coil connection is provided on that side of the second plane which faces the second coil axis, and the second coil connection is provided on that side of the third plane which is averted from the first coil axis. Owing to this arrangement, production is simplified.

According to a preferred embodiment, the device has a printed circuit board, and the first coil connection and the second coil connection are electrically and mechanically connected to the printed circuit board. The first coil can be readily provided on a printed circuit board.

According to a preferred embodiment, the first coil axis and the second coil axis are arranged parallel to the printed circuit board. As a result, firstly good cooling of the first coil both on the printed circuit board side and also on that side which is averted from the printed circuit board is possible. In addition, the arrangement is space-saving since the first coil is oriented horizontally and not vertically.

According to a preferred embodiment, the first coil axis and the second coil axis are at the same distance from the printed circuit board. This is space-saving.

According to a preferred embodiment, the device has a housing part, which housing part extends parallel to the printed circuit board in the region of the first coil, wherein the first coil is arranged between the housing part and the printed circuit board. A housing part of this kind can be positioned close to the first coils, and it can also be used for cooling purposes.

According to a preferred embodiment, the housing part is formed from aluminum or from an aluminum alloy at least in regions. This reduces the weight, and good cooling of the first coils is possible via the housing part.

According to a preferred embodiment, the device has at least two first coils through which the first magnet core extends, preferably at least four first coils, and particularly preferably at least five first coils. When a plurality of first coils are provided, the extended design of the first coils is advantageous since the input ends can be spatially separated from the output ends.

According to a preferred embodiment, the first coil elements of the at least two first coils are arranged coaxially in relation to one another and the second coil elements of the at least two first coils are arranged coaxially in relation to one another. This renders possible good separation between the first and the second coil connections of the different first coils.

According to a preferred embodiment, the device is interconnected with a circuit arrangement, which circuit arrangement has a power supply connection. As a result, the device can be used for filtering the phases and/or the neutral conductor.

According to a preferred embodiment, the first coil connections are each interconnected with the power supply connection via the circuit arrangement in order to provide filtered signals at the second coil connections. As a result, the filtered signals are all on one side of the device and spatially separated from the unfiltered signals.

According to a preferred embodiment, the first coils have a first first coil, a second first coil, a third first coil, a fourth first coil and a fifth first coil, and the device is interconnected via the circuit arrangement in such a way that the first first coil, the third first coil and the fifth first coil are provided for filtering a respectively associated phase, that the second first coil and the fourth first coil are provided for filtering a neutral conductor, that the second first coil is provided between the first first coil and the third first coil, and that the fourth first coil is provided between the third first coil and the fifth first coil. Owing to this arrangement, a neutral conductor coil is provided between two phase coils in each case, and the magnetic field can be readily built up in the magnet core as a result.

According to a preferred embodiment, the first winding connection or the second winding connection has a first curvature at least in sections, and the associated first coil element or second coil element has a second curvature, wherein the first curvature and the second curvature have opposite arithmetic signs. Owing to the opposite curvature, the two coil connections can be formed on a prespecified side of the first coil and nevertheless positioned comparatively far away from one another.

According to a preferred embodiment, the first coil is formed from a flat wire.

According to a preferred embodiment, a charging device for a traction battery has a device of this kind for filtering at least one signal.

BRIEF DESCRIPTION OF THE DRAWING FIGURES

Further details and advantageous developments of the invention can be found in the exemplary embodiments which are described below and illustrated in the drawings, which exemplary embodiments should in no way be interpreted as restricting the invention, and in the dependent claims. It is self-evident that the features mentioned above and those still to be explained below can be used not only in the respectively indicated combination but also in other combinations or on their own, without departing from the scope of the present invention. In the drawings

DETAILED DESCRIPTION OF THE INVENTION

In the text which follows, parts which are identical or act in an identical manner are provided with the same reference signs and usually will be described only once. The descriptions of all of the figures build one on the other in order to avoid unnecessary repetition.

Where relative terms such as left and right which are dependent on the figure direction are used in the text which follows, these relate to the respective figure.

Figure 1:
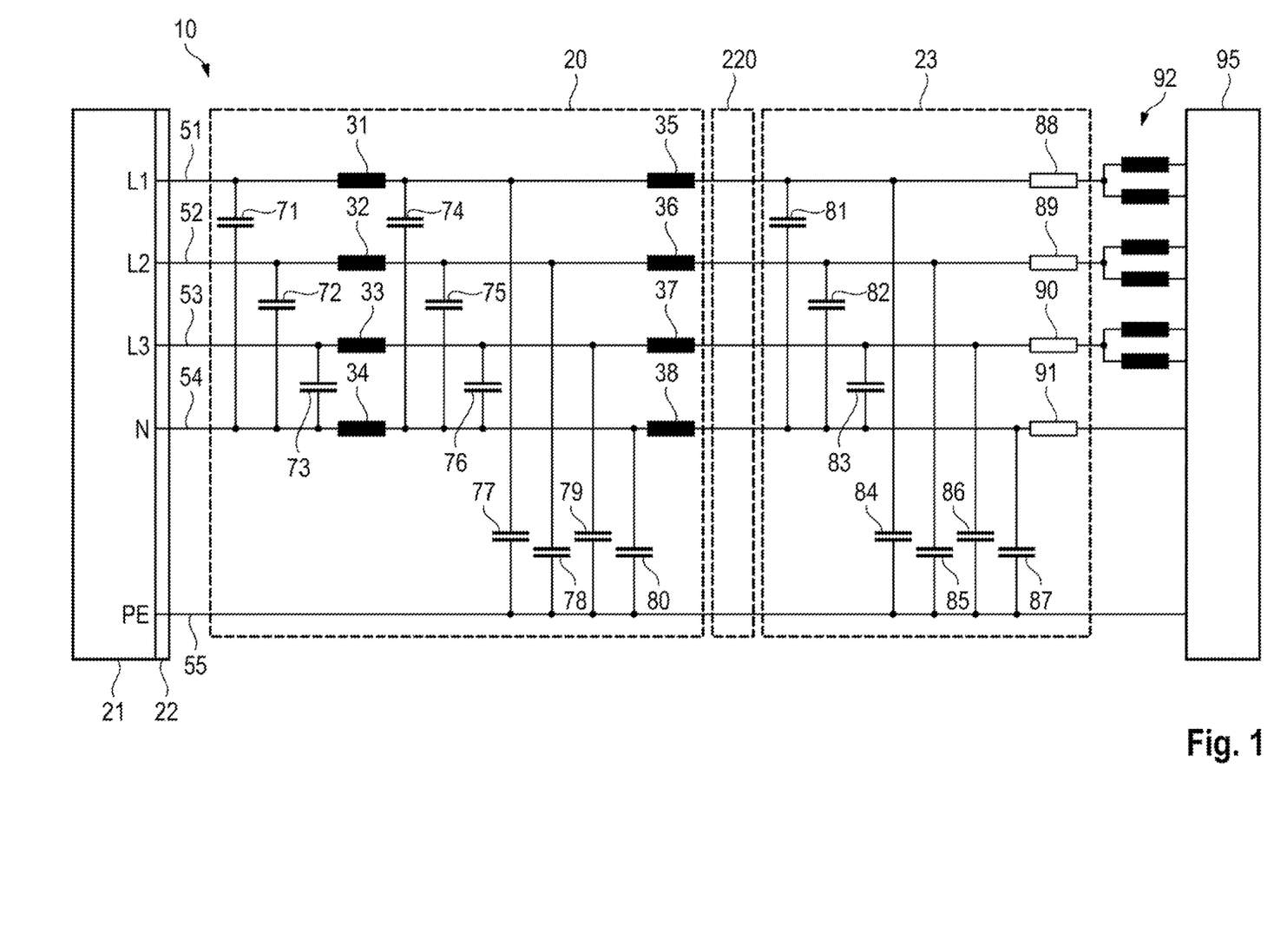
FIG. 1 shows a schematic illustration of an exemplary embodiment of a circuit arrangement comprising a filtering device.

FIG. 1 shows a circuit arrangement 10 which has five conductors 51, 52, 53, 54 and 55, which conductors 51, 52, 53, 54, 55 are electrically connected to a power supply connection 22, which power supply connection 22 is connected to a power supply 21, for example to a supply system. The conductors 51 to 55 can be connected, for example, to three phases L1, L2, L3, a neutral conductor N and a protective earth conductor PE via the power supply 21. Other power supplies are also possible, for example a single-phase power supply with L1, N and PE or a US split phase-type power supply with HOT1, HOT2 and PE. The circuit arrangement 10 has a device 20 for filtering the signals on the conductors 51, 52, 53 and 54. Starting from the power supply connection 22, the conductor 51 is connected to the conductor 54 via a capacitor 71, the conductor 52 is connected to the conductor 54 via a capacitor 72, and the conductor 53 is connected to the conductor 54 via a capacitor 73. Then, a first coil 31, 32, 33, 34 is provided on each of the conductors 51, 52, 53 and 54. Downstream of the first coils 31, 32, 33, 34, the first conductor 51 is connected to the conductor 54 via a capacitor 74, the conductor 52 is connected to the conductor 54 via a capacitor 75, and the conductor 53 is connected to the conductor 54 via a capacitor 76. Then, the conductor 51 is connected to the conductor 55 via a capacitor 77, the conductor 52 is connected to the conductor 55 via a capacitor 78, the conductor 53 is connected to the conductor 55 via a capacitor 79, and the conductor 54 is connected to the conductor 55 via a capacitor 80. Then, a second coil 35, 36, 37 and, respectively, 38 is provided on each of the conductors 51, 52, 53 and 54. The device 20 can also be called an AC filter, and it serves, for example, as a low-pass filter in order to filter high-frequency interference out of the power supply 21. The device 20 can also be designed as a band-pass filter for example, and the first coils 31, 32, 33, 34 can be used for different types of filter.

A device 220 which interacts with a plurality of the conductors 51, 52, 53, 54, 55 is schematically indicated to the right of the device 20. The device 220 serves, for example, to carry out compensation of leakage currents, and said device is not described in any detail.

A device 23 which preferably likewise serves as a filter for the conductors 51, 52, 53 and 54 is provided to the right of the device 220. In the device 23, the conductor 51 is connected to the conductor 54 via a capacitor 81, the conductor 52 is connected to the conductor 54 via a capacitor 82, and the conductor 53 is connected to the conductor 54 via a capacitor 83. Then, the conductor 51 is connected to the conductor 55 via a capacitor 84, the conductor 52 is connected to the conductor 55 via a capacitor 85, the conductor 53 is connected to the conductor 55 via a capacitor 86, and the conductor 54 is connected to the conductor 55 via a capacitor 87. To the right thereof, resistors 88, 89, 90 and, respectively, 91 are provided in the conductors 51, 52, 53, 54, which resistors are provided for current measurement in the conductors 51 to 54 for example. To the right of the device 23, inductors 92 are provided on the conductors 51, 52 and 53, which inductors are used for power factor correction for example.

The described circuit region preferably serves as an input region for a charging device 95 for a traction battery.

Figure 2:
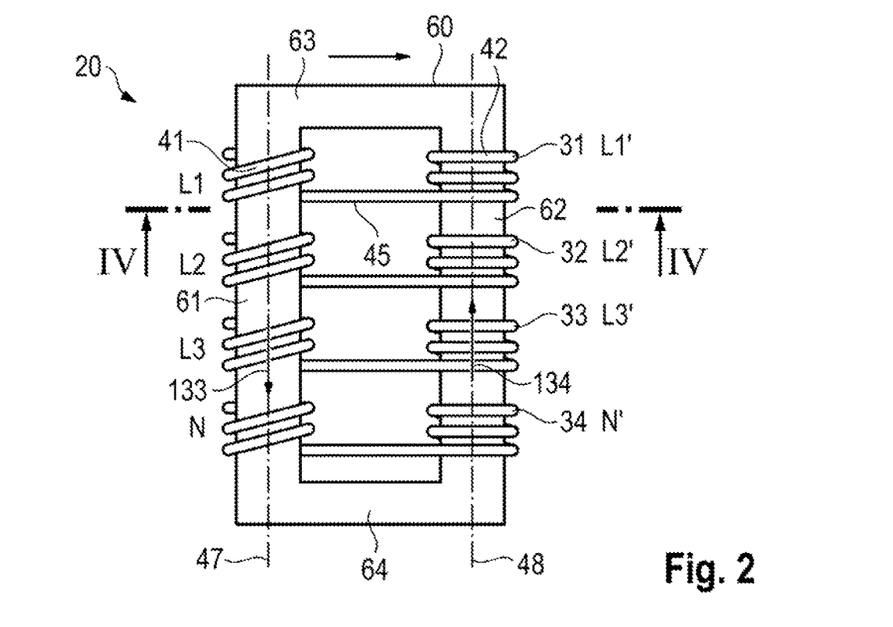
FIG. 2 shows a plan view of an exemplary embodiment of the filtering device from FIG. 1.

FIG. 2 shows the device 20 for filtering signals, in the present case for filtering the phases L1, L2, L3 and the neutral conductor N. The device 20 has a first magnet core 60 and at least one first coil 31. In the exemplary embodiment, four first coils 31, 32, 33, 34 are provided. The first coils 31, 32, 33, 34 each have a first coil element 41 and a second coil element 42. The first coil element 41 and the second coil element 42 are connected to one another via a connecting section 45. The first coil elements 41 lie on a common first coil axis 47, and the second coil elements 41 lie on a common second coil axis 48. In other words, the first coil elements 41 of the first coils 31, 32, 33, 34 are arranged coaxially in relation to one another, and the second coil elements 42 of the first coils 31, 32, 33, 34 are likewise arranged coaxially in relation to one another.

The magnet core 60 extends both through the first coil elements 41 and also through the second coil elements 42.

The magnet core 60 has a first section 61 and a second section 62, which sections run parallel to and at a distance from one another. The first coil elements 41 are arranged around the first section 61, and the second coil elements 42 are arranged around the second section 62. The first section 61 and the second section 62 are connected to one another on one side via a third section 63 and on the opposite side via a fourth section 64, so that the magnet core 60 has an annular structure and renders possible annular magnetic flux. In the exemplary embodiment, the third section 63 and the fourth section 64 are connected at right angles to the first section 61 and the second section 62. As an alternative, the third section 63 and the fourth section 64 can also be provided with a curvature at least in regions.

The first coil elements 41 are preferably each interconnected at the input end, for example with the power supply connection 22, and the second coil elements 42 are connected at the output end and provide a filtered signal. This is advantageous since the second coil elements 42 are at a distance from the first coil elements 41 and therefore the risk of radiation coupling between an input and a filtered output is reduced. In the exemplary embodiment, the left-hand side with the input signals L1, L2, L3 and N can be called the "dirty" side and the filtered right-hand side with the output signals L1', L2', L3' and N' can be called the "clean" side.

The first coil element 41 and the second coil element 42 are respectively wound in opposite directions in order to, given a prespecified current through the first coil 31, create induction in a first direction 133 in the first coil axis 47 and create induction in a second direction 134 in the second coil axis 48, which second direction 134 is opposite to the first direction 133.

Figure 3:
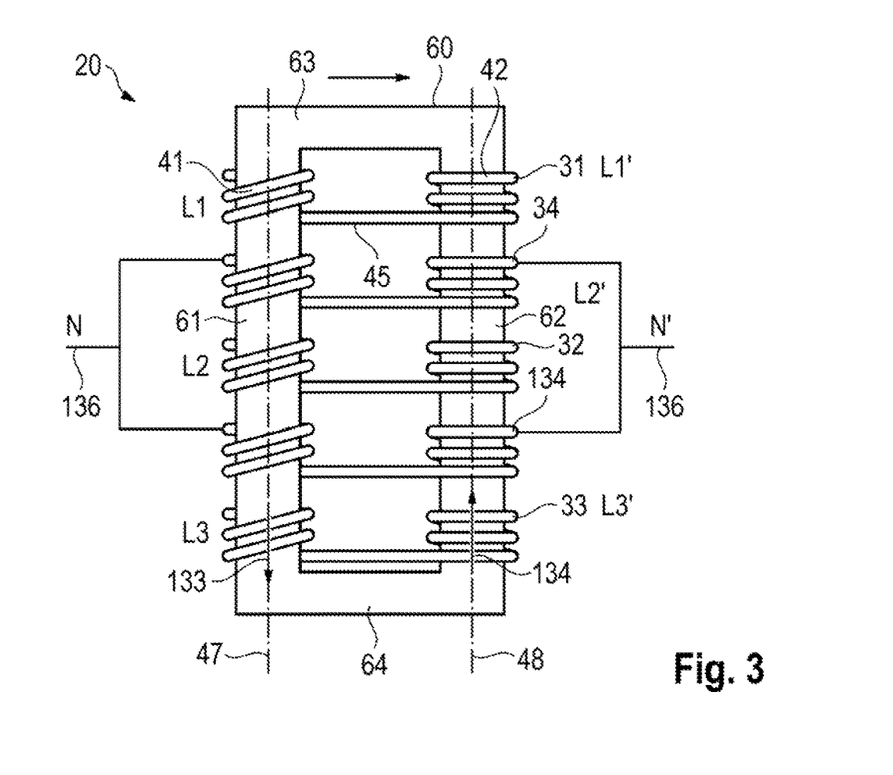
FIG. 3 shows a plan view of a further exemplary embodiment of the filtering device from FIG. 1.

FIG. 3 shows a further exemplary embodiment of the device 20. A total of five first coils 31, 34, 32, 134 and 33 are provided. In the case of a power supply with a three-phase power supply system, the phases L1, L2 and L3 are connected to the first coils 31, 32, 33 and transmitted via said coils. The neutral conductor N is split and transmitted via two first coils 34, 134. Here, the first coil 34 is preferably arranged between the first coil 31 and the first coil 32, and the first coil 134 is arranged between the first coil 32 and the first coil 33. A parallel circuit 136 is preferably provided for connecting the first coil 34 and the first coil 134 in parallel. Owing to the neutral conductor N being provided between the first coils 31, 32, 33 for the phases, the phases influence one another to a reduced extent. Field buildup in the magnet core 60 is improved as a result.

The first coils 31, 34, 32, 134, 33 can be called the first first coil 31, the second first coil 34, the third first coil 32, the fourth first coil 134 and the fifth first coil 33.

Figure 4:
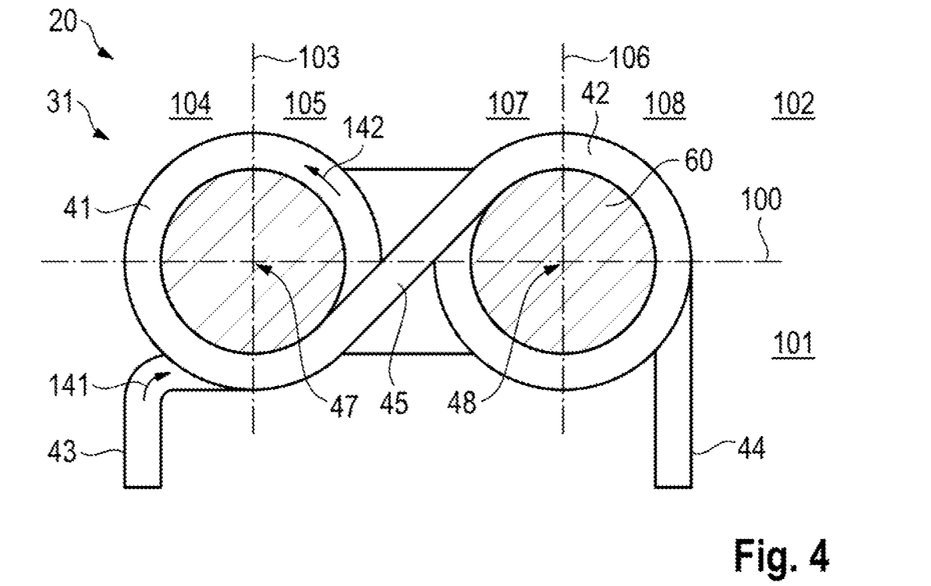
FIG. 4 shows a section along section line IV-IV from FIG. 2 of the device from FIG. 2 comprising a magnet core and a coil.

FIG. 4 shows a section along section line IV-IV from FIG. 2. The first coil 31 has a first coil connection 43, a second coil connection 44, the first coil element 41, the second coil element 42 and the connecting section 45. The first coil connection 43 is connected to the second coil connection 44 via the first coil element 41, the connecting section 45 and the second coil element 42. The first coil axis 47 and the second coil axis 48 are arranged parallel to and at a distance from one another, and the first magnet core 60 extends both through the first coil element 41 and also through the second coil element 42.

A change in the direction of curvature preferably takes place at the connecting section 45 since the first coil element 41 and the second coil element 42 are wound in opposite directions.

The first coil axis 47 and the second coil axis 48 define a first plane 100.

The first coil connection 43 and the second coil connection 44 are arranged on a first side 101 of the first plane 100 and point away from the first plane 100. Therefore, in particular, said coil connections do not run parallel to the first plane 100, but rather the end of the coil connections 43, 44 points away from the plane 100. The first coil connection 43 and the second coil connection 44 preferably point perpendicularly away from the first plane 100, as in the exemplary embodiment.

A second plane 103 is defined in that it is perpendicular to the first plane 100 and the first coil axis 47 is contained in it.

A third plane 106 is defined in that it is perpendicular to the first plane 100 and the second coil axis 48 is contained in it.

The first coil connection 43 is preferably provided at least partially or completely on that side 104 of the second plane 103 which is averted from the second coil axis 48.

The second coil connection 44 is preferably provided at least partially or completely on that side 108 of the third plane 106 which is averted from the first coil axis 47.

Owing to this arrangement of the first coil connection 43 and the second coil connection 44, they are arranged relatively far away from one another. This is advantageous since the signals at the first coil connection 43 and at the second coil connection 44 are not influenced or are only slightly influenced by radiation coupling as a result. The first coil 31 acts as a low-pass filter, and relatively high frequencies at the input (for example at the first coil connection 43) should be damped as highly as possible at the output (for example at the second coil connection 44).

The first winding connection 43 has a first curvature 141 at least in sections, and the associated first coil element 41 has a second curvature 142, wherein the first curvature 141 and the second curvature 142 have opposite arithmetic signs. The profile is therefore like that of an "S", wherein the radius of curvature of the first curvature 141 and of the second curvature 142 can be different. Given a reversed connection of the first coil 31, the same applies to the second coil connection 44.

Figure 5:
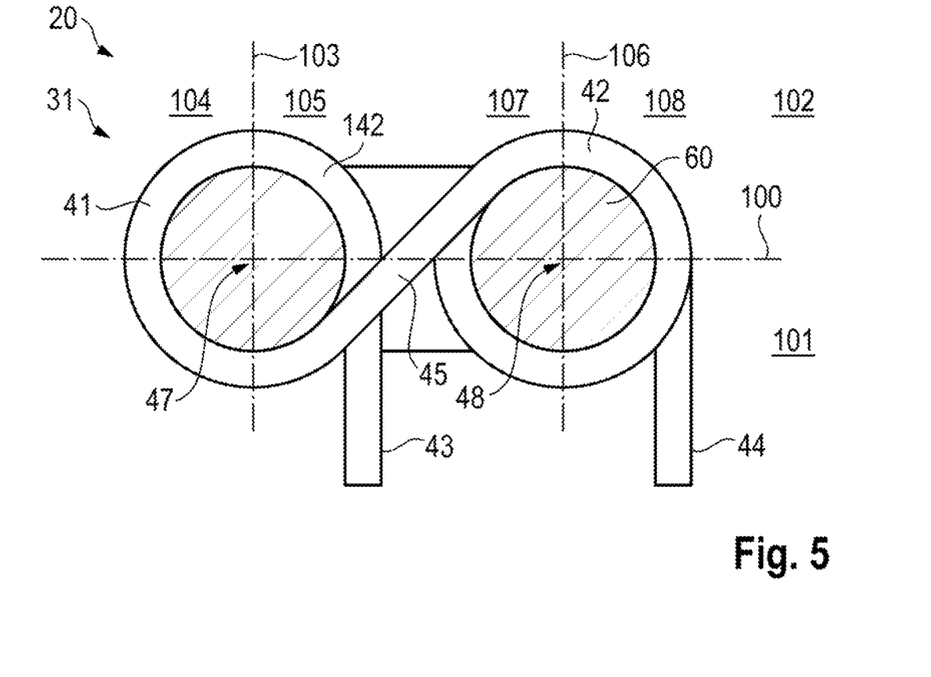
FIG. 5 shows a section corresponding to FIG. 4 of a further exemplary embodiment of the device from FIG. 4.

FIG. 5 shows a further embodiment of the device 20. The first plane 100, the second plane 103 and the third plane 106 are illustrated and defined as in FIG. 4.

Both coil connections 43, 44 point away from the first plane 100 on the first side 101, as in FIG. 4.

The first coil connection 43 is not provided on that side 104 of the second plane 103 which is averted from the second coil axis 48, but rather on that side 105 of the second plane 103 which faces the second coil axis 48. This produces a largely straight profile from the first coil element 41 to the first coil connection 43. This is easier for production of the first coil 31. However, it is disadvantageous that the first coil connection 43 is closer to the second coil connection 44 than in FIG. 4.

The second coil connection 44 is provided on that side 108 of the third plane 106 which is averted from the first coil axis 47, as in FIG. 4.

Figure 6:
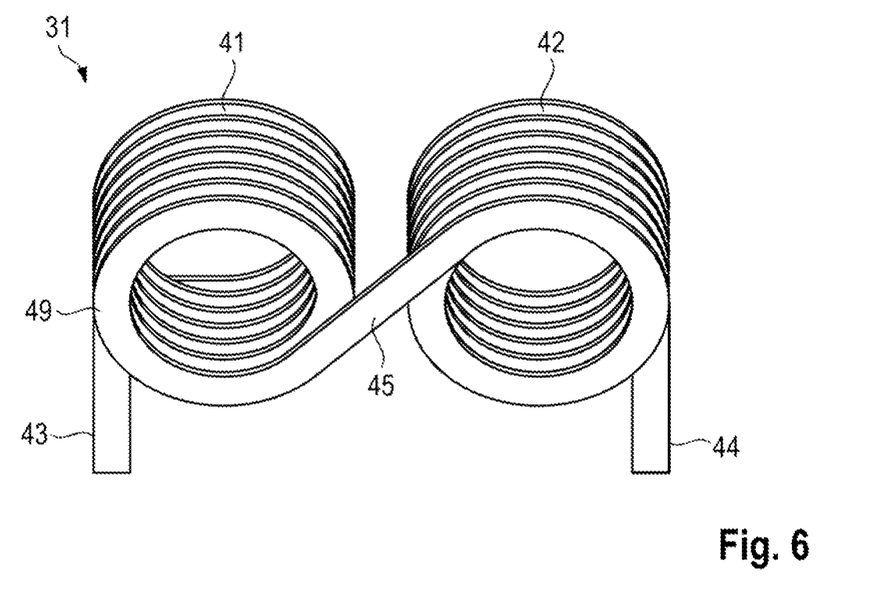
FIG. 6 shows a three-dimensional illustration of the coil from FIG. 4.

FIG. 6 shows a three-dimensional illustration of the first coil 31 from FIG. 4. The first coil 31 is preferably formed between the first coil connection 43 and the second coil connection 44 from a continuous wire 49. The wire 49 is preferably designed as a flat wire. This produces a compact configuration of the first coil 31 with a small axial length. The wire 49 preferably consists of copper or of a copper alloy or of another highly conductive metal. The wire 49 preferably has an insulation layer, for example a lacquer, on the surface, so that no short circuit is produced between the turns of the coil elements 41, 42. As an alternative, an insulator, for example an insulation paper, can be provided between the turns.

Figure 7:
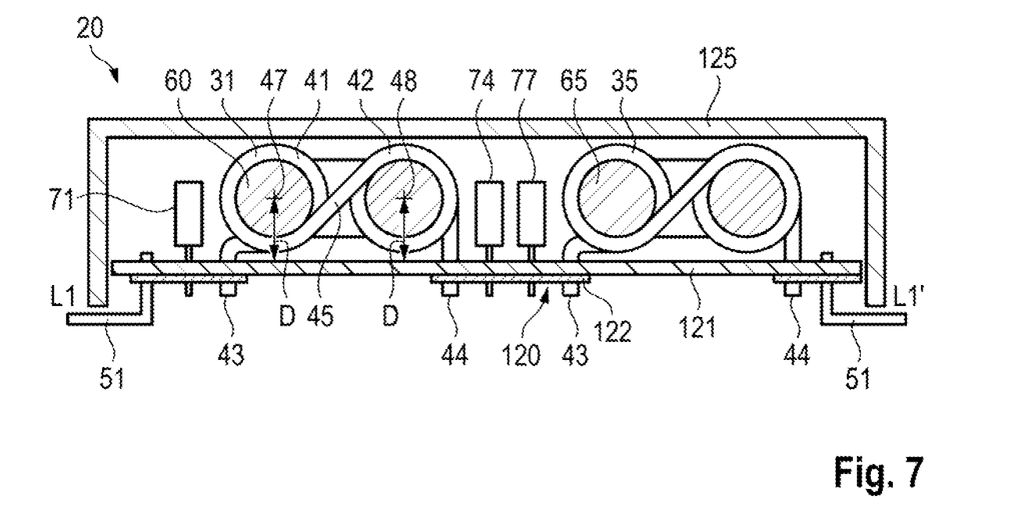
FIG. 7 shows a sectioned side view of a further exemplary embodiment of the device from FIG. 1.

FIG. 7 shows a schematic illustration of a further exemplary embodiment of the device 20. A printed circuit board 120 with a plastic carrier 121 and conductor tracks 122 is provided. The first coil 31 and the first magnet core 60 are sectioned in accordance with the illustration of FIG. 4, and the first coil connection 43 and the second coil connection 44 are electrically and mechanically connected to the printed circuit board 120.

The second coil 35 is constructed like the first coil 31 and is provided on a second magnet core 65. Said second coil is connected to the printed circuit board 120 in the same way. The first magnet core 60 and the second magnet core 65 and also the coils 31, 32, 33, 34 and, respectively, 134 are designed as in FIG. 2 or FIG. 3 for example.

The capacitors 71, 74, 77 of FIG. 1 are likewise illustrated by way of example and are connected to the printed circuit board 120. Therefore, all of the elements of the device 20 of FIG. 1 can be connected to the printed circuit board 120. Owing to the design of the first coils 31, 32, 33, 34 and of the second coils 35, 36, 37, 38, the signals can be conducted on the conductors 51 to 54 from the left-hand side of the illustration of FIG. 7 to the right-hand side, and the left-hand input end is spatially remote from the right-hand output end. This leads to a reduction in interference radiation.

The first coil axis 47 and the second coil axis 48 are arranged parallel to the printed circuit board 120. In other words, the first coil 31 is arranged horizontally on the printed circuit board 120. The printed circuit board 120 is flat at least in regions, in particular in the region in which the first coils 31, 35 are arranged.

The first coil axis 47 and the second coil axis 48 are at the same distance D from the printed circuit board 120.

The device 20 has a housing part 125, which housing part 125 extends parallel to the printed circuit board 120 in the region of the first coil 31, wherein the first coil 31 is arranged between the housing part 125 and the printed circuit board 120. This renders possible a compact arrangement, and in addition the first coils 31, 32, 33, 34 and respectively the second coils 35, 36, 37, 38 and the housing part 125 are in comparatively close proximity over a large surface area. As a result, the housing part 125 can readily serve as a cooling element. Contact can also be provided between the first coils and the housing part 125, for example directly or via a highly thermally conductive contact element—not illustrated.

The housing part 125 is preferably formed from aluminum or from an aluminum alloy at least in regions. This firstly saves weight, and secondly aluminum is highly suitable for transporting heat and has a good cooling effect. Another highly thermally conductive metal can also be used instead of the aluminum or the aluminum alloy.

In addition to the first coils 31, 32, 33, 34 or in addition to the second coils 35, 36, 37, 38 which are constructed in the same way, the device 20 can, of course, have additional coils—not illustrated—which are constructed in another way.

The first coil connections 43 are each interconnected with the power supply connection 22 via the circuit arrangement 10, and filtered signals are provided at the second coil connections 44. This results in good separation between the unfiltered inputs (coil connections 43) and the filtered outputs (coil connections 44).

Where parallel or perpendicular or the same distance is mentioned in the present application, these terms are not to be interpreted purely mathematically. Rather, it is clear to a person skilled in the art that there are manufacturing tolerances and entirely exact parallelism cannot be achieved for example—particularly in the case of small embodiments. Slight deviations of this kind are not critical to the functioning of the device.

It goes without saying that a wide range of variations and modifications are possible within the scope of the present invention.

The circuit of FIG. 1 has a combination L (31-34), C (77-80), L (35-38), C (84-87) for advantageous filtering. A simpler combination of L and C can be used for a simple solution.

What is claimed:

1. A device for filtering at least one signal, said device comprising:
   a first magnet core and at least one first coil,
   the first coil having a first coil connection, a second coil connection, a first coil element, a second coil element and a connecting section,
   the first coil connection being electrically connected to the second coil connection via the first coil element, the connecting section and the second coil element,
   the first coil element having a first coil axis and the second coil element having a second coil axis,
   the first coil axis and second coil axis being arranged parallel to and at a distance from one another,
   the first coil axis and the second coil axis defining a first plane,
   the first magnet core extending both through the first coil element and also through the second coil element, and
   wherein the first coil connection and the second coil connection are arranged on a first side of the first plane and point away from the first plane.

2. The device as claimed in claim 1, wherein the first coil element and the second coil element are wound in opposite directions in order to, given a prespecified current through the first coil, create induction in a first direction in the first coil axis and create induction in a second direction in the second coil axis, which second direction is opposite to the first direction.

3. The device as claimed in claim 1, wherein the first coil connection and the second coil connection point perpendicularly away from the first plane.

4. The device as claimed in claim 1,
wherein a second plane is defined perpendicular to the first plane and the first coil axis intersects the second plane, and
wherein a third plane is defined perpendicular to the first plane and the second coil axis intersects the third plane,
wherein the first coil connection is provided on a side of the second plane which is opposite from the second coil axis, and
wherein the second coil connection is provided on a side of the third plane which is opposite from the first coil axis.

5. The device as claimed in claim 1 further comprising a printed circuit board, and wherein the first coil connection and the second coil connection are electrically and mechanically connected to the printed circuit board.

6. The device as claimed in claim 5, wherein the first coil axis and the second coil axis are arranged parallel to the printed circuit board.

7. The device as claimed in claim 5, wherein the first coil axis and the second coil axis are positioned at the same distance (D) from the printed circuit board.

8. The device as claimed in claim 1, wherein the first magnet core extends through at least four first coils.

9. The device as claimed in claim 8, wherein the first coil elements of the at least two first coils are arranged coaxially in relation to one another, and wherein the second coil elements of the at least two first coils are arranged coaxially in relation to one another.

10. The device as claimed in claim 8, which is interconnected with a circuit arrangement, which circuit arrangement has a power supply connection.

11. The device as claimed in claim 10, wherein the first coil connections are each interconnected with the power supply connection via the circuit arrangement in order to provide filtered signals (L1', L2', L3', N') at the second coil connections.

12. The device as claimed in claim 1, wherein the first winding connection or the second winding connection has a first curvature at least in sections, and the associated first coil element or the second coil element has a second curvature, wherein the first curvature and the second curvature have opposite arithmetic signs.

13. A device for filtering at least one signal, said device comprising:
a first magnet core and at least one first coil,
the first coil having a first coil connection, a second coil connection, a first coil element, a second coil element and a connecting section,
the first coil connection being electrically connected to the second coil connection via the first coil element, the connecting section and the second coil element,
the first coil element having a first coil axis and the second coil element having a second coil axis,
the first coil axis and second coil axis being arranged parallel to and at a distance from one another,
the first magnet core extending both through the first coil element and also through the second coil element,
a printed circuit board, wherein the first coil connection and the second coil connection are electrically and mechanically connected to the printed circuit board, and
a housing part extending parallel to the printed circuit board in a region of the first coil, wherein the first coil is arranged between the housing part and the printed circuit board.

14. The device as claimed in claim 13, wherein the housing part is composed of aluminum or an aluminum alloy at least in regions.

15. An assembly comprising:
(i) a circuit arrangement having a power supply connection; and
(ii) a device interconnected to the circuit arrangement for filtering at least one signal, said device comprising a first magnet core and at least one first coil,
the first coil having a first coil connection, a second coil connection, a first coil element, a second coil element, and a connecting section,
the first coil connection being electrically connected to the second coil connection via the first coil element, the connecting section and the second coil element,
the first coil element having a first coil axis and the second coil element having a second coil axis,
the first coil axis and second coil axis being arranged parallel to and at a distance from one another,
the first magnet core extending both through the first coil element and also through the second coil element,
wherein the first magnet core extends through at least four first coils,
wherein the first coils have a first first coil, a second first coil, a third first coil, a fourth first coil and a fifth first coil, and said device is interconnected via the circuit arrangement in such a way that the first first coil, the third first coil and the fifth first coil are provided for filtering a respectively associated phase (L1, L2, L3),
wherein the second first coil and the fourth first coil are provided for filtering a neutral conductor (N),
wherein the second first coil is provided between the first first coil and the third first coil, and
wherein the fourth first coil is provided between the third first coil and the fifth first coil.

16. A device for filtering at least one signal, said device comprising:
a first magnet core and at least one first coil,
the first coil having a first coil connection, a second coil connection, a first coil element, a second coil element and a connecting section,
the first coil connection being electrically connected to the second coil connection via the first coil element, the connecting section and the second coil element,
the first coil element having a first coil axis and the second coil element having a second coil axis,
the first coil axis and second coil axis being arranged parallel to and at a distance from one another,
the first coil axis and the second coil axis defining a first plane,
the first magnet core extending both through the first coil element and also through the second coil element,
wherein a second plane is defined perpendicular to the first plane and the first coil axis intersects the second plane,
wherein a third plane is defined perpendicular to the first plane and the second coil axis intersects the third plane,
wherein the first coil connection is provided on a side of the second plane which faces the second coil axis, and wherein the second coil connection is provided on a side of the third plane which is opposite from the first coil axis.

* * * * *